United States Patent
Gabor et al.

(10) Patent No.: US 8,455,162 B2
(45) Date of Patent: Jun. 4, 2013

(54) ALIGNMENT MARKS FOR MULTI-EXPOSURE LITHOGRAPHY

(75) Inventors: Allen H. Gabor, Katonah, NY (US); Vinayan C. Menon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/170,316

(22) Filed: Jun. 28, 2011

(65) Prior Publication Data
US 2013/0001193 A1    Jan. 3, 2013

(51) Int. Cl.
*G03F 9/00* (2006.01)

(52) U.S. Cl.
USPC ............. 430/22; 430/312; 430/313; 430/316; 430/323; 430/329

(58) Field of Classification Search
USPC .................... 430/22, 312, 313, 316, 323, 329
See application file for complete search history.

(56) References Cited

U.S. PATENT DOCUMENTS

| | | | |
|---|---|---|---|
| 6,228,743 B1 | 5/2001 | Chen et al. | |
| 6,248,484 B1 | 6/2001 | Sajan et al. | |
| 6,271,919 B1 | 8/2001 | Matsuura | |
| 6,498,640 B1 | 12/2002 | Ziger | |
| 6,509,247 B2 | 1/2003 | Chen et al. | |
| 6,537,713 B2 | 3/2003 | Yeo | |
| 7,564,554 B2 | 7/2009 | Weiss | |
| 2001/0008790 A1 | 7/2001 | Chen et al. | |
| 2009/0230571 A1 | 9/2009 | Chen et al. | |

FOREIGN PATENT DOCUMENTS

JP    62-060223    3/1987

*Primary Examiner* — Christopher Young
(74) *Attorney, Agent, or Firm* — Scully, Scott, Murphy & Presser, P.C.; Parashos Kalaitzis, Esq.

(57) ABSTRACT

A plurality of reticles for printing structures in the same lithography level includes an alignment structure pattern within a same relative location in each reticle. Each set of process segmentations in a grating has a reticle segmentation pitch, which is common across all gratings in the plurality of reticles. Within each pair of alignment structure patterns that occupy the same relative location in any two of the plurality of reticles, the process segmentations in one reticle are shifted relative to the process segmentations in the other reticle by a fraction of a reticle segmentation pitch. After printing all patterns in the plurality of reticles, a composite printed process segmentation structure on the substrate includes printed segmentation structures that are spaced by 1/n times the printed segmentation pitch. The pattern for the next level can be aligned to the composite printed process segmentation structure in a single alignment operation.

15 Claims, 10 Drawing Sheets

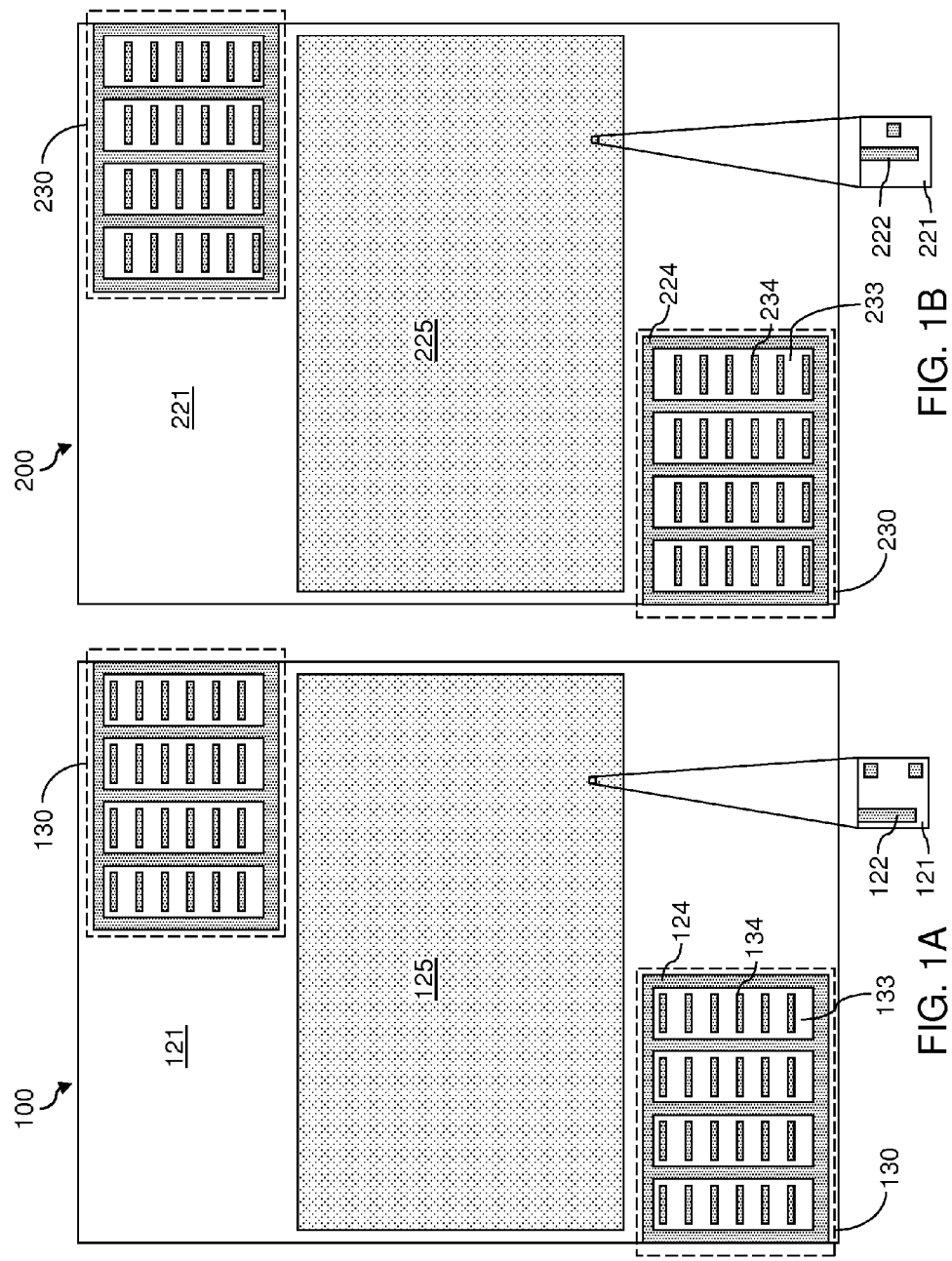

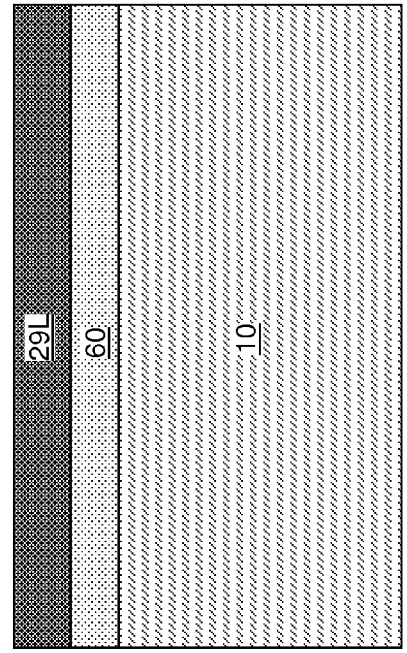
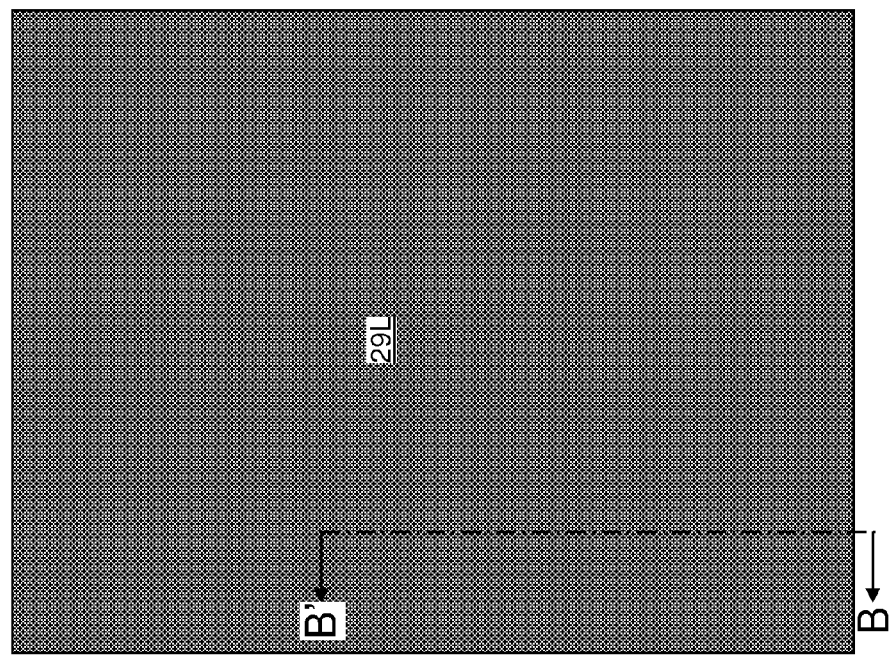
FIG. 2B
FIG. 2A

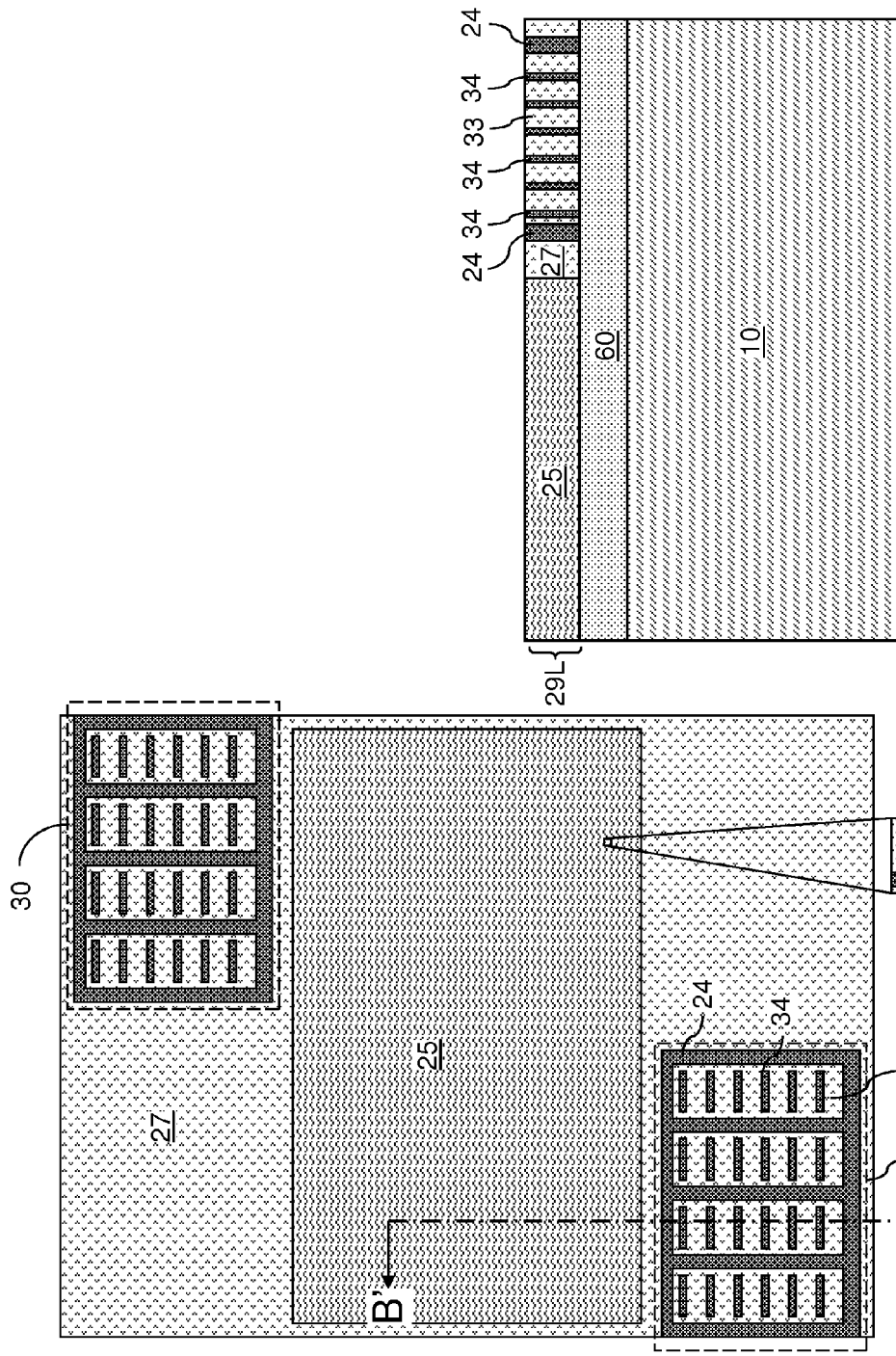

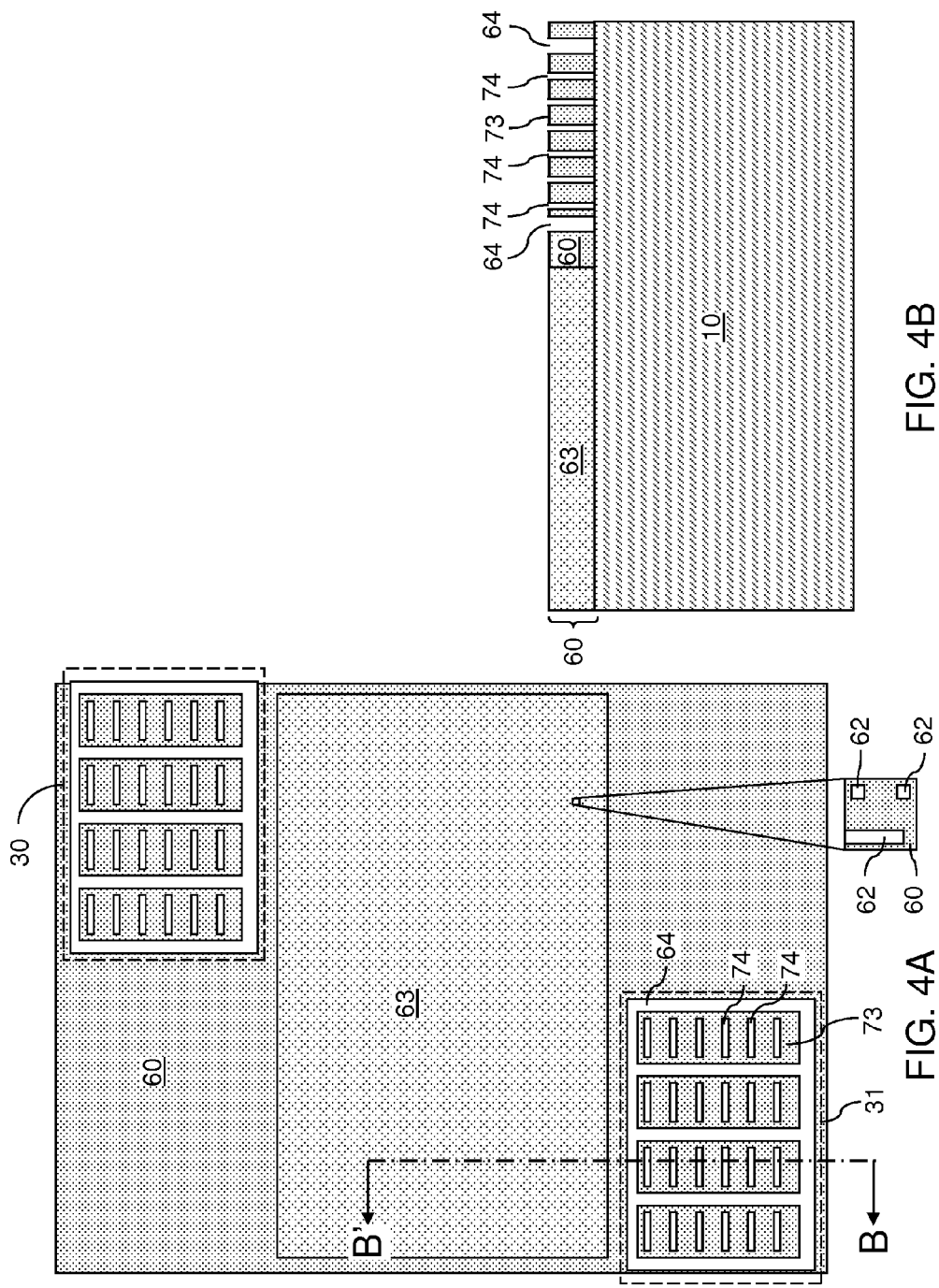

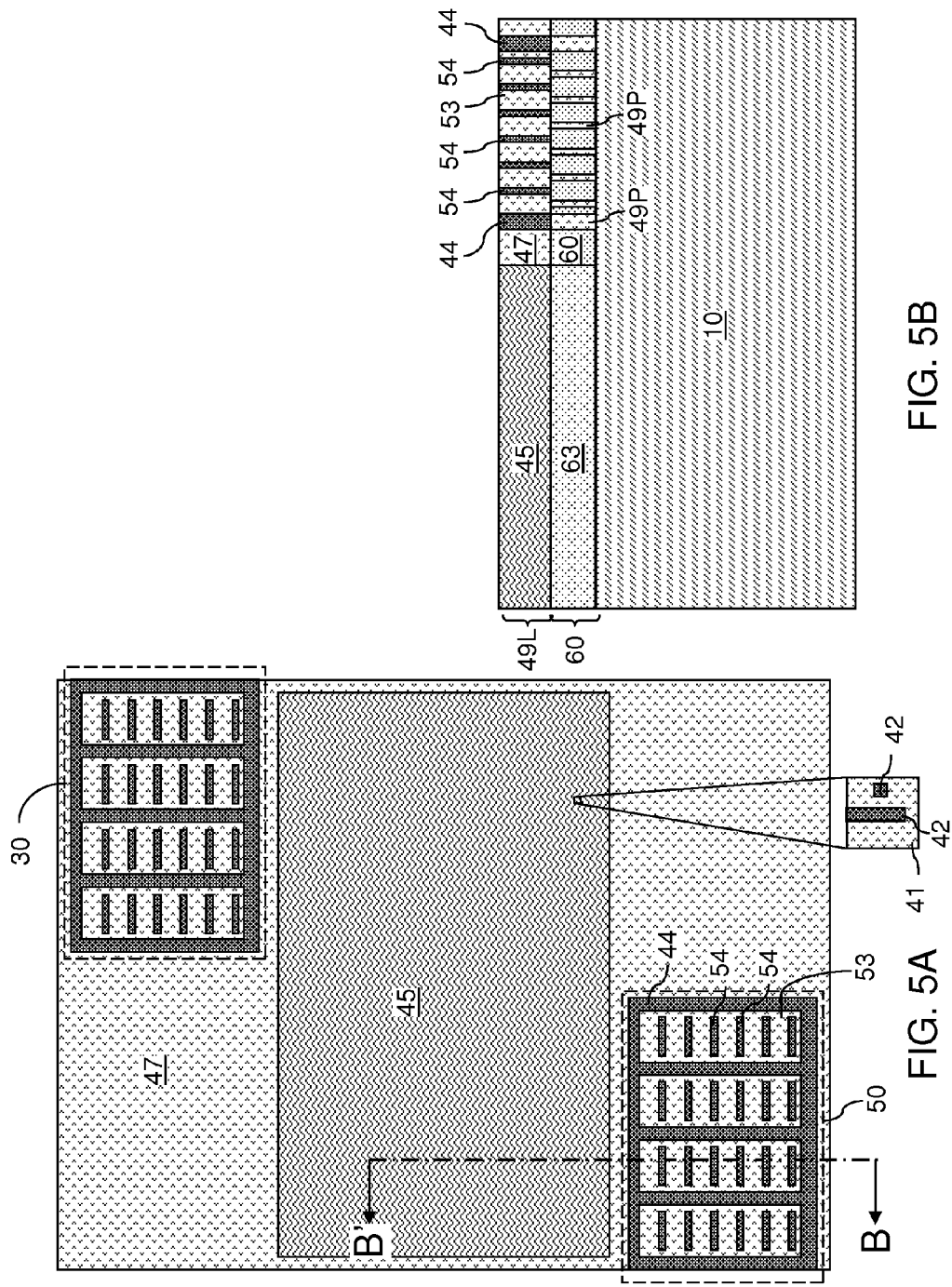

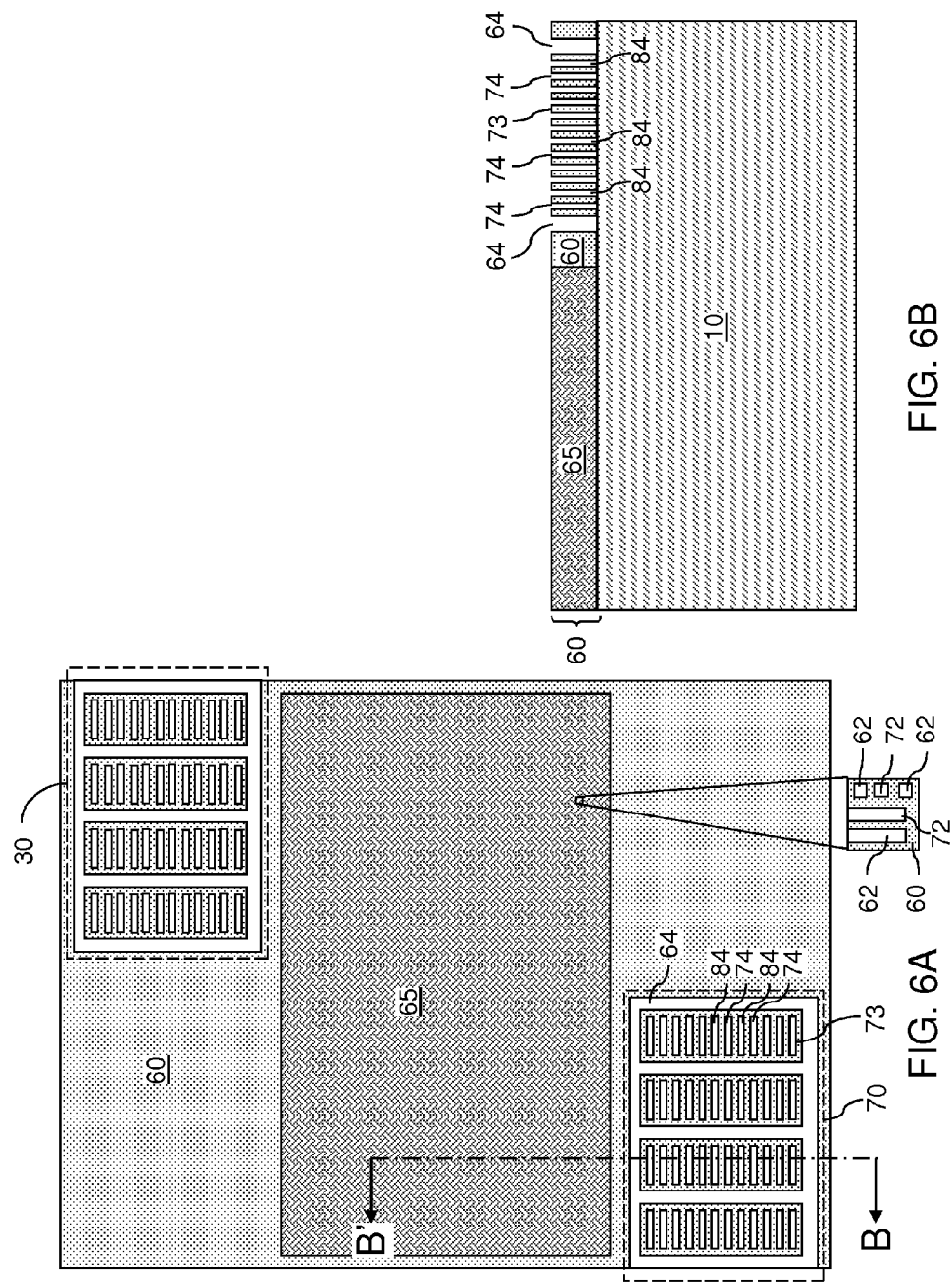

ALIGNMENT MARKS FOR MULTI-EXPOSURE LITHOGRAPHY

BACKGROUND

The present disclosure relates to lithographic methods, and particularly to a method of aligning a lithographic mask to a substrate including a patterned underlying level structure printed with a plurality of lithographic masks and reticles employed for the method.

A reticle, or a lithographic mask, comprises a transparent reticle substrate and a patterned optically opaque coating thereupon; alternatively, a photomask may comprise a transparent reticle substrate with a partially transmissive layer, or with features etched out of the substrate to achieve optical phase shifting by changing the optical path length. The reticle is mounted into an exposure tool, which may be integrated into a tool called a stepper, so that radiation from a source of the exposure tool passes through the reticle and impinges on a photoresist applied to a top surface of a semiconductor substrate. The pattern of the reticle is thus transferred into the photoresist during the exposure so that the photoresist may have the same pattern as the pattern of the reticle after development. The reticle may be repeatedly employed to replicate the pattern in the reticle in the photoresist material on multiple semiconductor substrates. The coating on the reticle is optically opaque at the wavelength of the radiation source. Typical wavelengths of radiation that are employed for photolithography include 365 nm, 248 nm, 193 nm, 157 nm, etc. Such deep ultraviolet (DUV) wavelengths may be employed to pattern features having dimensions of 50 nm or greater in the photoresist.

A pattern in a single level can be formed by multiple lithographic masks. The need to employ multiple lithographic masks to print a pattern in a single level arises because of the limitations on lithographic capabilities. For example, patterns in proximity to each other cannot be printed with fidelity due to optical interferences during exposure. Thus, a single lithographic pattern including minimum size features can be divided into two complementary patterns or a set of more than two patterns the sum of which constitutes a complete pattern. Such division of a complete pattern for a single level into multiple sub-patterns can be performed, for example, at gate level, at contact level, at via levels, and/or at metal line levels.

When multiple exposures are employed to pattern a structure at a single level, alignment of the next level structure to the previous level becomes challenging. The throughput of an exposure tool decreases because the reticle for the new level needs to be aligned to each set of alignment marks associated with a previous level lithographic mask and physically printed on a substrate including a photoresist. The alignment tool then optimizes overlay errors so that the alignment of the image for the current level to each previous level pattern does not exceed a preset limit, or is otherwise optimized to enhance overall alignment between the current level and the previous level. Thus, the total time that the exposure tool spends for alignment increases with the total number of reticles employed to print the previous level, thereby adversely affecting the throughput of the exposure tool.

In addition, an alignment structure pattern is present in a reticle for each printed alignment structure that is lithographically formed on a substrate. Thus, each alignment structure pattern takes up space in a reticle, and reduces area available for printing device structures within a die area.

BRIEF SUMMARY

A plurality of reticles for printing structures in the same lithography level includes an alignment structure pattern within a same relative location in each reticle. Each alignment structure pattern includes a set of gratings, and each grating includes an array of process segmentations. Each set of process segmentations in a grating has a reticle segmentation pitch, which is common across all gratings in the plurality of reticles. Within each pair of alignment structure patterns that occupy the same relative location in any two of the plurality of reticles, the process segmentations in one reticle are shifted relative to the process segmentations in the other reticle by j/n times the reticle segmentation pitch, in which n is an integer that is equal to the total number of reticles within the plurality of reticles, and j is a positive integer less than n. Printing a pattern on a physical structure on a substrate employing each of the plurality of reticles generates one set of printed segmentation structures having a printed segmentation pitch determined by the reticle segmentation pitch and a scaling factor determined by the optics of an exposure tool. Each reticle generates a set of printed segmentation structures that is offset from another set by k/n times the printed segmentation pitch, in which k is a positive integer less than n. After printing all patterns in the plurality of reticles, a composite printed process segmentation structure on the substrate includes printed segmentation structures that are spaced by 1/n times the printed segmentation pitch. The pattern for the next level can be aligned to the composite printed process segmentation structure in a single alignment operation.

According to an aspect of the present disclosure, a method of forming a patterned structure is provided. The method includes: patterning a material layer on a substrate by sequentially forming multiple printed lithographic patterns therein, wherein each of the multiple printed lithographic patterns includes a set of printed process segmentation structures having a printed segmentation pitch, and the sets of printed process segmentation structures collectively form composite printed process segmentation structures having a composite printed segmentation pitch that is 1/n times the printed segmentation pitch, wherein n is a total number of the multiple printed lithographic patterns; and aligning a reticle to the substrate employing the composite printed process segmentation structures as a reference structure for alignment.

According to another aspect of the present disclosure, a set of reticles is provided. Each reticle in the set of reticles includes an alignment structure pattern at a same relative location. Each alignment structure pattern includes a set of gratings including process segmentations. The process segmentations have a reticle segmentation pitch p within each of the set of gratings. A relative position of the alignment structure pattern in an (i+1)-th reticle is laterally offset by a distance of 1/n times the reticle segmentation pitch p in a direction of the reticle segmentation pitch p relative to a corresponding alignment structure pattern in an i-th reticle for each i between and including 1 and (n−1), wherein n is a total number of reticles in the set of reticles.

BRIEF DESCRIPTION OF THE SEVERAL VIEWS OF THE DRAWINGS

FIG. 1A is a top-down view of a first reticle among a first exemplary plurality of reticles according to a first embodiment of the present disclosure.

FIG. 1B is a top-down view of a second reticle among the first exemplary plurality of reticles according to the first embodiment of the present disclosure.

FIG. 2A is a top-down view of an exemplary lithographic structure after application of a first photoresist-including layer according to the first embodiment of the present disclosure.

FIG. 2B is a vertical cross-sectional view of the exemplary lithographic structure of FIG. 2A along the vertical plane of B-B' according to the first embodiment of the present disclosure.

FIG. 3A is a top-down view of the exemplary lithographic structure after lithographic patterning of the first photoresist-including layer employing the first reticle according to the first embodiment of the present disclosure.

FIG. 3B is a vertical cross-sectional view of the exemplary lithographic structure of FIG. 3A along the vertical plane of B-B' according to the first embodiment of the present disclosure.

FIG. 4A is a top-down view of the exemplary lithographic structure after transfer of a first pattern into a material layer according to the first embodiment of the present disclosure.

FIG. 4B is a vertical cross-sectional view of the exemplary lithographic structure of FIG. 4A along the vertical plane of B-B' according to the first embodiment of the present disclosure.

FIG. 5A is a top-down view of the exemplary lithographic structure after application and lithographic patterning of a second photoresist-including layer employing the second reticle according to the first embodiment of the present disclosure.

FIG. 5B is a vertical cross-sectional view of the exemplary lithographic structure of FIG. 5A along the vertical plane of B-B' according to the first embodiment of the present disclosure.

FIG. 6A is a top-down view of the exemplary lithographic structure after transfer of a second pattern into the material layer according to the first embodiment of the present disclosure.

FIG. 6B is a vertical cross-sectional view of the exemplary lithographic structure of FIG. 6A along the vertical plane of B-B' according to the first embodiment of the present disclosure.

DETAILED DESCRIPTION

Figures 1C, 1D:
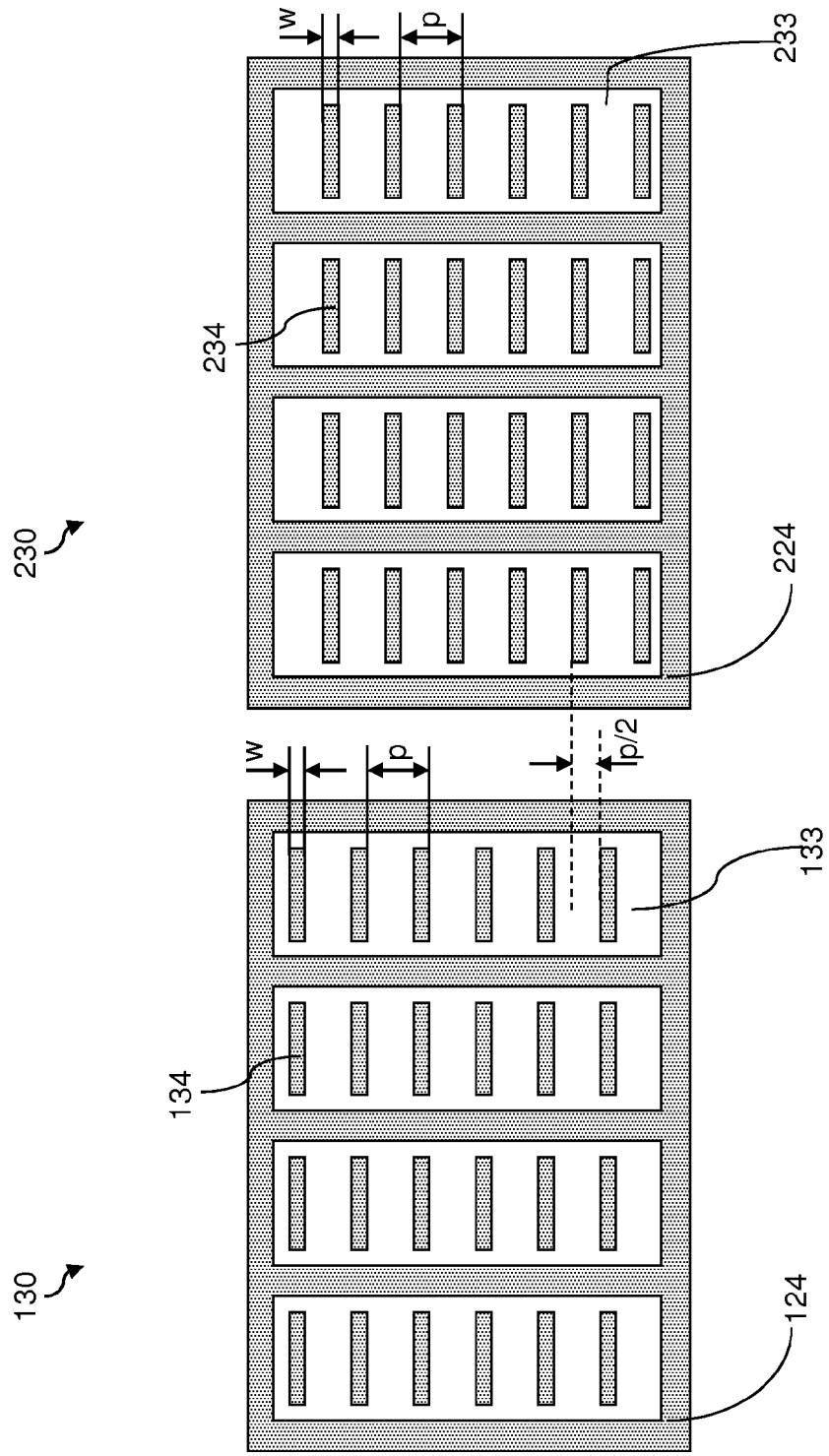
FIG. 1C is a magnified view of a first alignment structure pattern within the first reticle according to the first embodiment of the present disclosure.
FIG. 1D is a magnified view of a second alignment structure pattern within the second reticle according to the first embodiment of the present disclosure.

As stated above, the present disclosure relates to a method of aligning a lithographic mask to a substrate including a patterned underlying level structure printed with a plurality of lithographic masks and reticles employed for the method, which is now described in detail with accompanying figures. Throughout the drawings, the same reference numerals or letters are used to designate like or equivalent elements. The drawings are not necessarily drawn to scale.

Referring to FIGS. 1A-1D, a first exemplary plurality of reticles according to a first embodiment of the present disclosure includes a first reticle 100 and a second reticle 200. The first reticle 100 and the second reticle 200 include different components of a lithographic pattern for a same lithographic level. For example, the lithographic level can be a recessed oxide (RX) level employed to define shallow trench isolation regions on a semiconductor substrate, a gate conductor (GC) level employed to define gate conductors on the semiconductor substrate, a local interconnect (LI) level employed to define local interconnects and/or contact vias formed on the surface of the semiconductor substrate, a via (VX) level employed to define metal vias in a metal interconnect structure, or a line (MX) level employed to define metal lines in the metal interconnect structure.

The lithographic pattern for a given level can be decomposed into two or more component lithographic patterns. When the two or more component lithographic patterns are added together, the sum of the two or more component lithographic patterns corresponds to the lithographic pattern for the level. The advantage of breaking up a lithographic pattern for a level into multiple component lithographic patterns is the ability to print sublithographic features that would not be printable through a single lithographic exposure and development.

In the scheme illustrated in FIGS. 1A-1D, a lithographic pattern is divided into a first component pattern and a second component pattern. The first component pattern is defined in the first reticle 100, for example, within a first device pattern area 125 present in the first reticle 100. The second component pattern is defined in the second reticle 200, for example, within a second device pattern area 225 present in the second reticle 200. The first device pattern area 125 and the device pattern area 225 can have the same shape for the periphery and the same area if the first reticle 100 and the second reticle 200 are designed to employ the same type of lithographic tool, i.e., the same wavelength for the light source and the same numerical aperture.

Each reticle (100, 200) includes a transparent substrate and a patterned opaque layer. The patterned opaque layer includes the pattern for the first or second component pattern. Each reticle (100, 200) can have a positive polarity or a negative polarity. A positive reticle has a transparent background area in which the patterned opaque layer is absent, and includes opaque areas defined by the presence of the patterned opaque layer. A negative reticle has an opaque background in which the patterned opaque layer is present, and includes transparent areas defined by the absence of the patterned opaque layer. While the present disclosure is described employing positive reticles, a corresponding counterpart employing negative reticles instead of positive reticles can readily be practiced by those skilled in the art. Further, the combination of a transparent substrate and a patterned opaque layer may be replaced by a substrate having a pattern of reflective portions and absorptive portions as in the case of extreme ultraviolet (EUV) lithography masks.

For example, the first reticle 100 includes a first transparent area 121 and the first device pattern area 125. First opaque regions 122 present within the first device pattern area 125 define the first component pattern against the background of the first transparent area 121 within the first device pattern area 125 as illustrated by an inset in FIG. 1A. Likewise, the second reticle 200 includes a second transparent area 221 and the second device pattern area 225. Second opaque regions 222 present within the second device pattern area 225 define the second component pattern against the background of the second transparent area 221 within the second device pattern area 125 as illustrated by an inset in FIG. 1B.

Each reticle (100, 200) also includes structures for enabling alignment of the reticle relative to a substrate on which the pattern in the reticle is to be transferred by exposure and development. A structure on a reticle (100, 200) configured for use in a lithography tool for alignment purposes is referred to as an "alignment structure pattern." The lithography tool may be use a diffraction-based alignment scheme or an image-based alignment scheme in order to align a lithographic mask to a substrate. The first reticle 100 includes first alignment structure patterns 130. The second reticle 200 includes second alignment structure patterns 230. The set of areas for the first alignment structure patterns 130 in the first reticle 100 and the set of areas for the second alignment structure patterns 230 in the second reticle are congruent, i.e., overlap each other if the first reticle 100 and the second reticle 200 are stacked on each other.

Further, a pair of corresponding alignment structure patterns across the first reticle 100 and the second reticle 200 is located in the same relative location with respect to the first device pattern area 125 or with respect to the second device pattern area 225. For example, the first device pattern area 125 and the second device pattern area 125 can be congruent, and the relative location of the first alignment structure pattern 130 in the lower left corner of the first reticle 100 with respect to the first device pattern area 125 can be identical to the location of the second alignment structure pattern 230 in the lower left corner of the second reticle 200 with respect to the second device pattern area 225. Likewise, the relative location of the first alignment structure pattern 130 in the upper right corner of the first reticle 100 with respect to the first device pattern area 125 can be identical to the location of the second alignment structure pattern 230 in the upper right corner of the second reticle 200 with respect to the second device pattern area 225.

The area of each alignment structure pattern can be defined by the presence or absence of an opening in the optically opaque layer on the reticle. For example, each area of the first alignment structure patterns 130 on the first reticle 100 can be defined by a first opaque periphery region 124, which includes an opaque periphery, i.e., an opaque frame 124. While the present disclosure is described employing alignment structure patterns having an opaque periphery, embodiments in which the polarity of the pattern is reversed, i.e., having transparent periphery regions, can also be employed.

Each alignment structure pattern (130, 230) includes a set of gratings. For example, each of the first alignment structure patterns 130 can include a set of first gratings 133, and each of the second alignment structure patterns 230 can include a set of second gratings 233. Each set of first gratings 133 on the first reticle 100 can be defined by a set of transparent areas placed within the first opaque periphery region 124. Likewise, each set of first gratings 233 on the second reticle 200 can be defined by a set of transparent areas placed within the second opaque periphery region 224. Each grating within a set of gratings (133, 233) is laterally spaced from another grating by an opaque portion of the first opaque periphery region 124 or the second opaque periphery region 224. While the present disclosure is described employing sets of gratings defined by transparent areas, embodiments in which the polarity of the pattern is reversed, i.e., having opaque gratings, can also be employed.

Each grating includes an array of process segmentations. For example, each first grating 133 includes an array of first process segmentations 134, and each second grating 233 includes an array of second process segmentations 234. Each first process segmentation 134 can be defined by an opaque area placed within a first grating 133, and each second process segmentation 234 can be defined by an opaque area placed within a second grating 233. Each first process segmentation 134 can be laterally spaced from another first process segmentation 134 in a horizontal direction perpendicular to the horizontal direction along which first gratings 133 are spaced within a first alignment structure pattern 130. Likewise, each second process segmentation 234 can be laterally spaced from another second process segmentation 234 in a horizontal direction perpendicular to the horizontal direction along which second gratings 233 are spaced within a second alignment structure pattern 230. While the present disclosure is described employing process segmentations defined by opaque areas, embodiments in which the polarity of the pattern is reversed, i.e., having transparent process segmentations, can also be employed.

In one embodiment, each first process segmentation 134 can be defined by an opaque area placed within a first grating 133, and each second process segmentation 234 can be defined by an opaque area placed within a second grating 233. Each first process segmentation 134 can be laterally spaced from another first process segmentation 134 in a horizontal direction perpendicular to the horizontal direction along which first gratings 133 are spaced within a first alignment structure pattern 130. Likewise, each second process segmentation 234 can be laterally spaced from another second process segmentation 234 in a horizontal direction perpendicular to the horizontal direction along which second gratings 233 are spaced within a second alignment structure pattern 230. While the present disclosure is described employing process segmentations defined by opaque areas, embodiments in which the polarity of the pattern is reversed, i.e., having transparent process segmentations, can also be employed.

Each set of process segmentations (134 or 234) in a grating (133 or 233) has a reticle segmentation pitch p, which is common across all gratings (133, 233) in the plurality of reticles employed to form a composite lithographic pattern for a level, i.e., the first reticle 100 and the second reticle 200 if the composite pattern is divided into two component patterns. Each process segmentation (134, 234) can have the same width, which is herein referred to as a reticle segmentation width w.

Across the first reticle 100 and the second reticle 200, within each pair of alignment structure patterns (130, 230) that occupy the same relative location, the process segmentations (130, 230) in one reticle are shifted relative to the process segmentations (230, 130) in the other reticle by ½ times the reticle segmentation pitch p. This shift is illustrated in FIGS. 1C and 1D, in which lengthwise edges (shown as horizontal edges in FIGS. 1C and 1D) of the first alignment structure pattern 130 in the lower left corner of the first reticle 100 are placed at the same vertical position as the lengthwise edges of the second alignment structure pattern 230 in the lower left corner of the second reticle 100. The offset in the relative positions of the process segmentations (230, 130) across the first and second reticles (100, 200) enables cumulative printing of structures representing the process segmentations (230, 130) within the same area of a substrate during multiple lithographic exposures and developments employing multiple reticles, e.g., the first reticle 100 and the second reticle 200.

While the drawings illustrate an embodiment in which the lengthwise direction of the first process segmentations 134 and the second process segmentations 234 is parallel, or perpendicular, to edges of the first opaque periphery region 124 and the second opaque periphery region 224 (horizontal or vertical directions in FIGS. 1C and 1D), embodiments in which the lengthwise direction(s) of the first process segmentations 134 and/or the second process segmentations 234 is/are at an angle between 0 degree and 90 degrees with respect to the edges of the first opaque periphery region 124 and/or the second opaque periphery region 224 can also be implemented.

Referring to FIGS. 2A and 2B, an exemplary lithographic structure includes a substrate 10, a first material layer 60 deposited on the top surface of the substrate 10, and a first photoresist-including layer 29L deposited on the first material layer 60. The substrate 10 can be a semiconductor substrate including a semiconductor material such as silicon, germanium, a silicon-germanium alloy, or any compound semiconductor material known in the art. The first material layer 60 can be a dielectric material layer, a semiconductor material layer, a conductive material layer, or a composite stack including a combination thereof. The first photoresist-including layer 29L can include an optional organic planarizing material layer, a photoresist layer, and an antirefelective coating (ARC) layer as known in the art.

Referring to FIGS. 3A and 3B, the first photoresist-including layer 29L is lithographically patterned employing the first reticle 100 as an exposure mask. An exposed lithographic pattern, i.e., a lithographic pattern defined by the exposure of the photoresist material therein, is formed in the first photoresist-including layer 29L. The exposed lithographic pattern replicates the first component pattern in the first reticle 100.

The first photoresist-including layer 29L is divided into two types of areas depending on lithographic exposure, i.e., lithographically exposed photoresist regions and lithographically unexposed photoresist portions. The portion of the first photoresist-including layer 29L corresponding to the first device pattern area 125 of the first reticle 100 becomes a first patterned photoresist region 25 including first lithographically exposed pattern area photoresist portions 21 and first lithographically unexposed pattern area photoresist portions 22. Additional lithographically unexposed photoresist portions 27 (and/or additional lithographically exposed photoresist portions) can also be formed in areas reserved for printed alignment structures (not shown) previously formed or to be subsequently formed for other levels.

The exposed lithographic pattern replicates all features of the first alignment structure patterns 130, the first opaque periphery region 124, the first gratings 133, and the first process segmentations 134. Specifically, each first opaque periphery region 124 is replicated as a first photoresist periphery portion 24 that includes an unexposed portion of the first photoresist-including layer 29L, each first grating 133 is replicated in the exposed lithographic pattern as a first photoresist grating pattern portion 33 that includes an exposed portion of the first photoresist-including layer 29L, and each first process segmentation 134 is replicated as a first photoresist process segmentation portion 34 that includes an unexposed portion of the first photoresist-including layer 29L. Thus, each first alignment structure pattern 130 is replicated in the exposed lithographic pattern as a first photoresist alignment pattern portion 30. While the present disclosure is described employing first opaque periphery regions 124 and first process segmentations 134 defined by opaque areas in the first reticle 100 and first photoresist periphery portions 24 and first photoresist process segmentation portions 34 defined by unexposed portions of the first photoresist-including layer 29L, embodiments in which the polarity of the pattern is reversed can also be employed.

The exposed lithographic pattern is subsequently developed. Depending on whether the first photoresist-including layer 29L includes a positive resist or a negative resist, lithographically exposed portions or lithographically unexposed portions of the first photoresist-including layer 29L may be removed. A positive resist is a type of photoresist in which lithographically exposed portions of the photoresist becomes soluble to a photoresist developer solution, while unexposed portions of the photoresist remains insoluble to the photoresist developer solution. A negative resist is a type of photoresist in which lithographically exposed portions of the photoresist becomes insoluble to a photoresist developer solution, while unexposed portions of the photoresist remains soluble to the photoresist developer solution.

In the embodiment illustrated herein, the first photoresist-including layer 29L includes a negative photoresist. Thus, the lithographically unexposed photoresist portions are removed during development, for example, by being dissolved in a photoresist developer solution. As discussed above, the lithographically unexposed portions of the first photoresist-including layer 29L can include first photoresist periphery portions 24 and first photoresist process segmentation portions 34 as well as first lithographically unexposed pattern area photoresist portions 22. The lithographically exposed photoresist portions remain after development defines a first pattern, which includes a lithographic pattern that replicates the first component pattern in the first reticle 100 by defining openings in the first photoresist-including layer 29L. Portions of the top surface of the first material layer 60 are physically exposed below the openings.

Referring to FIGS. 4A and 4B, the first pattern in the first photoresist-including layer 29L is transferred into the first material layer 60, for example, by an anisotropic etch. The anisotropic etch can be a reactive ion etch that employs etchants such as hydrofluorocarbon gases as known in the art. The first pattern in the first photoresist-including layer 29L is transferred into a physical structure below the first photoresist-including layer 29L, i.e., the first material layer 60. The remaining portions of the first photoresist-including layer 29L, including any organic planarizing material layer, if present, is removed after the anisotropic etch, for example, by ashing.

The first pattern is printed in the first material layer 60 by an anisotropic etch that employs the remaining portion of the first photoresist-including layer 29L as an etch mask. The first pattern as printed in the first material layer 60 includes a first printed device region 63, which is a replica of a pattern in the first device pattern area 125 within the first reticle 100. The first printed device region 63 includes the first material layer 60 having first openings 62 therein. The openings 62 define the pattern in the first printed device region 63. The ratio of the size of the first printed lithographic pattern 63 on the substrate 10 to the size of the first device pattern area 125 on the first reticle 100 is determined by the numerical aperture of lithographic tool employed to lithographically expose the first photoresist-including layer 29L.

In addition, the first pattern as printed in the first material layer 60 includes features replicating additional patterns in the first reticle 100, which include the first alignment structure patterns 130. Specifically, each first opaque periphery region 124 is replicated as a printed periphery portion 64 in the form of a contiguous opening in the first material layer 60, each first grating 133 is replicated as a printed grating 73 in the form of an unetched remaining portion of the first material layer 60, and each first process segmentation 134 is replicated as a first printed process segmentation structures 74 in the form of a discrete opening in a printed grating 73 in the first material layer 60. The collection of a printed periphery portion 64, printed gratings 73, and first printed process segmentation structures 74 corresponding to a first alignment structure pattern 130 constitute a first printed alignment structure 31. Thus, each first alignment structure pattern 130 is replicated in the patterned first material layer 60 as a first printed alignment structure 31.

Each set of first printed process segmentation structures 74 within a printed grating has a pitch, which is determined by the numerical aperture of a lithography tool and the reticle segmentation pitch p. The pitch of the second photoresist process segmentation portion 54 is herein referred to as a printed segmentation pitch.

Referring to FIGS. 5A and 5B, a second photoresist-including layer 49L is deposited on the first material layer 60. The second photoresist-including layer 49L can include an optional organic planarizing material layer 49P, a photoresist layer, and an antireflective coating (ARC) layer as known in the art. Typically, the organic planarizing material layer 49P within the second photoresist-including layer 49L fills the openings within the first material layer 60 so that the photoresist layer within the second photoresist-including layer 49L can have a constant thickness throughout the entire area over the substrate 10.

The second reticle 200 is aligned to the pattern in the first material layer 60 for exposure of the second photoresist-including layer 49. Specifically, the first printed alignment structures 31 present in the first material layer 60 are employed so that the position of a pattern replicating the second alignment structure patterns 230 coincide with the position of the first printed alignment structures 31 upon alignment. Specifically, the image of a set of second gratings 233 in a second alignment structure pattern 230 is congruent with the corresponding shape of the printed gratings 73 derived from the first grating 133 in the first reticle 100 located in the same relative location as the set of second gratings 233. Thus, by laterally moving the substrate 10, the substrate 10 can be positioned so that the position of the image of the set of second gratings 233 coincides with the corresponding printed gratings 73.

The second photoresist-including layer 49L is lithographically patterned employing the second reticle 200 as an exposure mask. An exposed lithographic pattern is formed in the second photoresist-including layer 49L. The exposed lithographic pattern replicates the second component pattern in the second reticle 200.

The second photoresist-including layer 49L is divided into two types of areas depending on lithographic exposure, i.e., lithographically exposed photoresist regions and lithographically unexposed photoresist portions. The portion of the second photoresist-including layer 49L corresponding to the second device pattern area 225 of the second reticle 200 becomes a second patterned photoresist region 45 including second lithographically exposed pattern area photoresist portions 41 and first lithographically unexposed pattern area photoresist portions 42. Additional lithographically unexposed photoresist portions 47 (and/or additional lithographically exposed photoresist portions) can also be formed in areas reserved for printed alignment structures (not shown) previously formed or to be subsequently formed for other levels.

The exposed lithographic pattern replicates all features of the second alignment structure patterns 230, the second opaque periphery region 224, the second gratings 233, and the second process segmentations 234. Specifically, each second opaque periphery region 224 is replicated as a second photoresist periphery portion 44 that includes an unexposed portion of the second photoresist-including layer 49L, each second grating 233 is replicated in the exposed lithographic pattern as a second photoresist grating pattern portion 53 that includes an exposed portion of the second photoresist-including layer 49L, and each second process segmentation 234 is replicated as a second photoresist process segmentation portion 54 that includes an unexposed portion of the second photoresist-including layer 49L. Thus, each second alignment structure pattern 230 is replicated in the exposed lithographic pattern as a second photoresist alignment pattern portion 50. While the present disclosure is described employing second opaque periphery regions 224 and second process segmentations 234 defined by opaque areas in the second reticle 200 and second photoresist periphery portions 44 and second photoresist process segmentation portions 54 defined by unexposed portions of the second photoresist-including layer 49L, embodiments in which the polarity of the pattern is reversed can also be employed.

As discussed above, the second process segmentations 234 are laterally offset relative to the corresponding first process segmentations 134 by one half of the reticle segmentation pitch p in the direction of the reticle segmentation pitch p, which is the horizontal direction perpendicular to the periodicity of the first gratings 133 or the periodicity of the second gratings 233. Thus, while the location of each second photoresist grating pattern portion 53 coincide with the location of a printed gratings 73 as manifested in the first material layer 60, the location of each set of second photoresist process segmentation portions 54 within a second photoresist grating pattern portion 53 is laterally offset from the corresponding set of first printed process segmentation structures 74 manifested within the first material layer as openings (and filled by unexposed portions of the second photoresist-including layer 49L) by one half of the pitch of the second photoresist process segmentation portion 54, i.e., by ½ times the printed segmentation pitch.

The exposed lithographic pattern is subsequently developed. Depending on whether the second photoresist-including layer 49L includes a positive resist or a negative resist, lithographically exposed portions or lithographically unexposed portions of the second photoresist-including layer 49L may be removed.

In the embodiment illustrated herein, the second photoresist-including layer 49L includes a negative photoresist. Thus, the lithographically unexposed photoresist portions are removed during development, for example, by being dissolved in a photoresist developer solution. As discussed above, the lithographically unexposed portions of the second photoresist-including layer 49L can include second photoresist periphery portions 44 and second photoresist process segmentation portions 54 as well as second lithographically unexposed pattern area photoresist portions 42. The lithographically exposed photoresist portions remain after development defines a second pattern, which includes a lithographic pattern that replicates the second component pattern in the second reticle 100 by defining openings in the second photoresist-including layer 49L. Portions of the top surface of the second material layer 60 are physically exposed below the openings. The images of the second opaque periphery regions 224 can coincide with the area of the printed periphery portions 64.

Referring to FIGS. 6A and 6B, the second pattern in the second photoresist-including layer 49L is transferred into the first material layer 60, for example, by an anisotropic etch. The anisotropic etch can be a reactive ion etch that employs etchants such as hydrofluorocarbon gases as known in the art. The second pattern in the second photoresist-including layer 49L is transferred into the physical structure below the second photoresist-including layer 49L, i.e., the first material layer 60. The organic planarizing material layer 49P (within the second photoresist-including layer 49L) filling the openings within the first material layer 60 protects the underlying substrate 10 during the anisotropic etch. The remaining portions of the second photoresist-including layer 49L, including the organic planarizing material layer 49P filling the preexisting openings in the first material layer 60 according to the first pattern, is removed after the anisotropic etch, for example, by ashing.

The anisotropic etch employs the remaining portion of the second photoresist-including layer 49L as an etch mask. The second pattern is additionally printed in the first material layer 60, i.e., in addition to the previously printed first pattern that is now present within the first material layer 60 and defined by the first openings 72 and features in the first printed alignment structures 31 (See FIGS. 4A and 4B). Second openings 72 are formed in the first material layer 60 by this anisotropic etch. The second openings 72 define the second pattern that is added to the first pattern. The second pattern as additionally printed in the first material layer 60 forms a composite printed lithographic pattern. The composite printed lithographic pattern includes a composite printed device region 65, which includes the pattern in the first device pattern area 125 within the first reticle 100 and the pattern in the second device pattern area 225 within the second reticle 200. The composite printed device region 65 is the portion of the first material layer 60 having the first openings 62 and the second openings 72 therein. The ratio of the size of the composite printed lithographic device pattern 65 on the substrate 10 to the size of the second device pattern area 225 on the second reticle 200 is determined by the numerical aperture of lithographic tool employed to lithographically expose the second photoresist-including layer 49L.

In addition, the composite printed lithographic pattern, as printed by the two anisotropic etches into the first material layer 60, includes features replicating additional patterns in the first reticle 100 and the second reticle 200. Particularly, the composite printed lithographic pattern include structures derived from the first alignment structure patterns 130 and the second alignment structure patterns 230, which are printed alignment structures 70.

Within each printed alignment structure 70, the images of the first opaque periphery region 124 and the images of the second opaque periphery region 224 coincide, and collectively form the printed periphery portions 64. Each printed periphery portion 64 is in the form of a contiguous opening in the second material layer 60. Further, the images of the first gratings 133 and the images of the second gratings 233 coincide within each printed alignment structure 70, and collectively form the printed gratings 73. The printed gratings 73 are unetched remaining portions of the first material layer 60. Printed gratings 73 within a printed alignment structure 70 can be laterally spaced in a one-dimensional periodic structure with a periodicity in one direction, e.g., in a horizontal direction perpendicular to the B-B' plane in FIG. 6A.

Each first process segmentation 134 is replicated as first printed process segmentation structures 74 in the form of a discrete opening in a printed grating 73 in the first material layer 60. The first process segmentations 134 have the printed segmentation pitch in one direction. Each second process segmentation 234 is replicated as a second printed process segmentation structure 74 in the form of a discrete opening in a printed grating 73 in the first material layer 60. The second process segmentations 234 have the printed segmentation pitch in the same direction as the pitch of the first printed process segmentation structures 84, which is the printed process segmentation pitch.

The collection of the first printed process segmentation structures 74 and the second printed process segmentation structures 84 constitute composite printed process segmentation structures. Due to the design of the first and second reticles (100, 200) and the alignment methods described above the first printed process segmentation structures 74 and the second printed process segmentation structures 84 are laterally offset in the direction of the pitch of the first printed process segmentation structures 74, which is the same as the direction of the pitch of the second printed process segmentation structures 84. Thus, the composite printed process segmentation structures (74, 84) has a pitch that is ½ of the pitch of the first printed process segmentation structures 74.

While the present disclosure is described above for an embodiment in which each of the multiple printed lithographic patterns is formed by a separate lithographic processing sequence including application of a photoresist-including layer, lithographic exposure of the photoresist-including layer, and transfer of a lithographic pattern in the photoresist-including layer into the material layer by an etch, alternative lithographic pattern transfer methods can also be employed in some other embodiments. For example, litho-freeze-litho-etch (LFLE) process or dual exposure track only pitch split (DETOPS) process as known in the art can be employed. The LFLE process is described, for example, in U.S. Patent Application Publication No. 2011/0081618 to Wang et al., and the DETOPS process is described, for example, in U.S. Patent Application Publication No. 2011/0049680 to Burns et al., which are incorporated herein by reference.

Figures 7A, 7B:
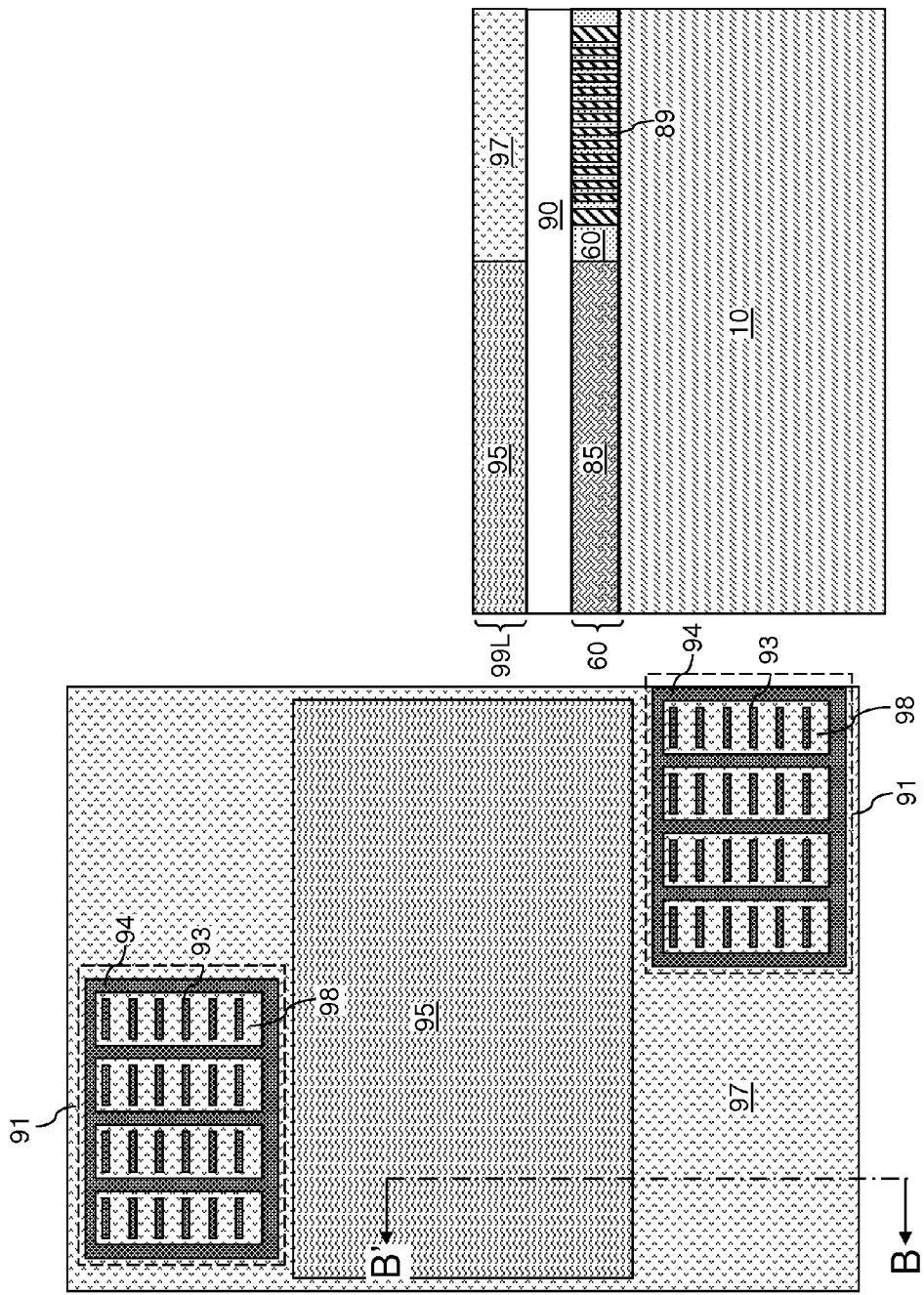
FIG. 7A is a top-down view of the exemplary lithographic structure after deposition of a second material layer and application and lithographic patterning of a third photoresist-including layer according to the first embodiment of the present disclosure.
FIG. 7B is a vertical cross-sectional view of the exemplary lithographic structure of FIG. 7A along the vertical plane of B-B' according to the first embodiment of the present disclosure.

Referring to FIGS. 7A and 7B, the openings in the first material layer 60 can be filled by a complementary material having a different property than the material of the first material layer 60. For example, the complementary material can be a conductive material such as metal or a doped semiconductor material if the material of the first material layer 60 is a dielectric material. Alternately, the complementary material can be an insulator material such as silicon oxide, silicon dioxide, organosilicate glass, or any other dielectric material known in the art, if the material of the first material layer 60 is a conductive material or a doped semiconductor material.

Thus, a complimentarily filled device region 85 including dielectric materials and conductive materials are formed by filling the openings (62, 72) in the composite printed device region 65. Further, alignment fill structures 89 are formed within the each printed alignment structure 70 by filling openings of the printed alignment structure 70 within the first material layer 60 with the complimentary material.

In one embodiment, the excess complementary material can be removed from above the first material layer 60, for example, by chemical mechanical planarization (CMP) or a recess etch. A second material layer 90 can be separately deposited over the first material layer 60 filled with the complementary material and subsequently planarized. The second material layer 90 can include a conductive material, a dielectric material, or a semiconductor material as known in the art.

In another embodiment, the planarization process may be omitted, and the excess complimentary material can remain over the first material layer 65 to form a second material layer 90. The second material layer 90 can include a conductive material, a dielectric material, or a semiconductor material as known in the art.

A third photoresist-including layer 99L is subsequently applied on the second material layer 90. The substrate 10 is loaded into a lithography tool. An upper level reticle (not shown) is also loaded into the lithography tool, and is aligned to the substrate 10 employing the composite printed process segmentation structures (74, 84) as reference structures for alignment. While the first material layer 60 includes a composite pattern derived from multiple reticles, i.e., the first reticle 100 and the second reticle, each of the composite printed process segmentation structures (74, 84) are located in a single alignment structure. Thus, the total number of alignment structures that the lithography tool needs to locate is the same as if a single reticle was used to form the composite pattern. Thus, the time required for aligning the upper level reticle to the existing composite printed process segmentation structures (74, 84) can be the same as the time required for alignment of a substrate including a pattern derived from a single mask.

The same processing scheme can be employed for the upper level reticle. In other words, the upper level reticle employed herein may be a first reticle among a set of two upper level reticles. The lithographic exposure of the third photoresist-including layer 99L can form a third patterned photoresist region 95 including third lithographically exposed pattern area photoresist portions 27 and first lithographically unexposed pattern area photoresist portions (not shown). In addition, third photoresist alignment pattern portion 91 can be formed. Each third photoresist alignment pattern portion 91 can include a third photoresist periphery portions 94, third photoresist grating pattern portions 98, and third photoresist process segmentation portions 94.

While the present disclosure is described by a combination of positive reticles and negative photoresists, embodiments in which different combinations of reticle types and photoresist types are employed can also be practiced. Alternative combinations include a combination of positive reticles and positive photoresists, negative reticles and positive photoresists, or negative reticles and negative photoresists.

Figures 8A, 8B:
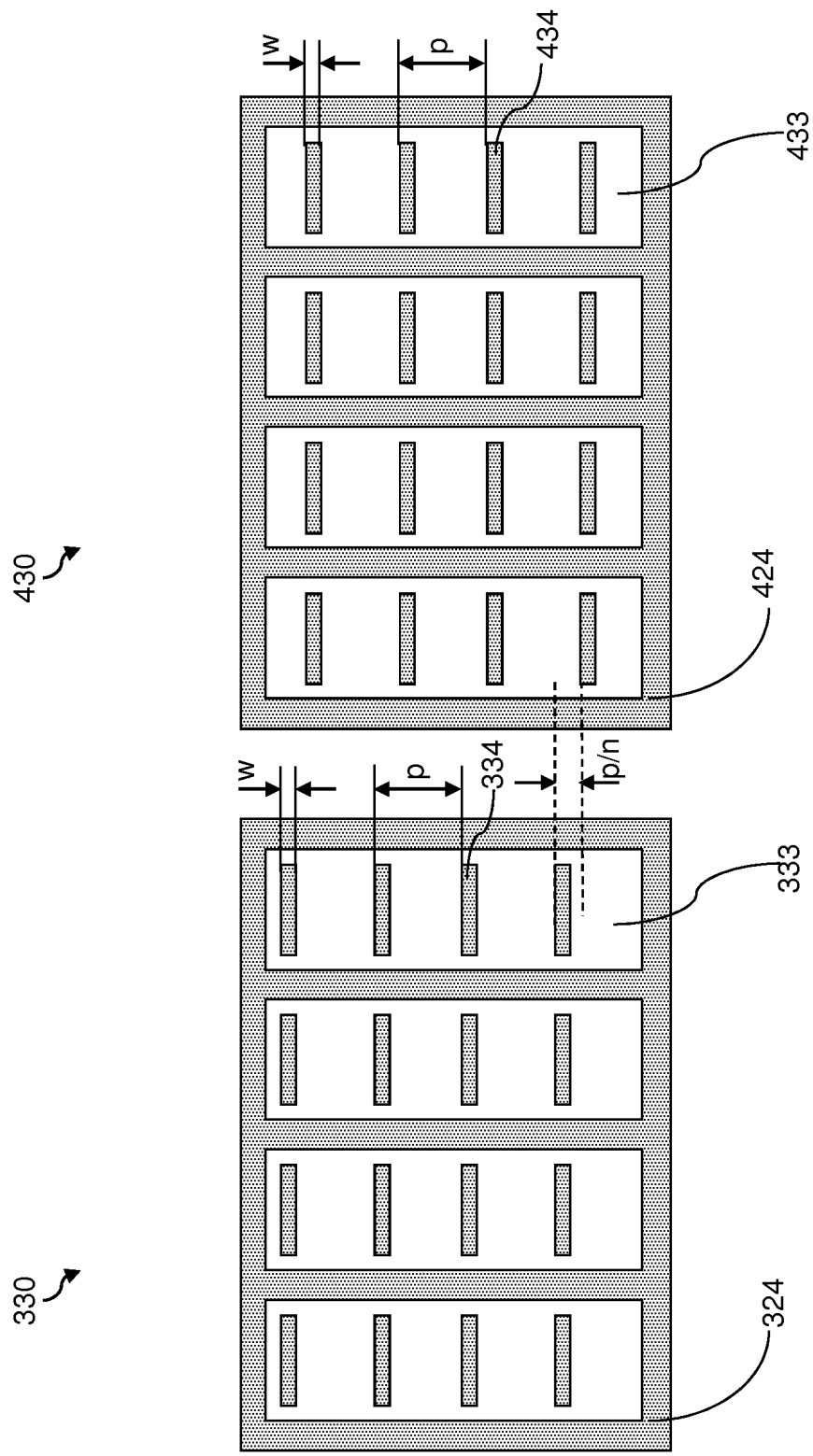
FIG. 8A is a top-down view of a first alignment structure pattern within a first reticle in a second exemplary plurality of reticles according to a second embodiment of the present disclosure.
FIG. 8B is a top-down view of a second alignment structure pattern within a second reticle in the second exemplary plurality of reticles according to the second embodiment of the present disclosure.
Figure 8C:
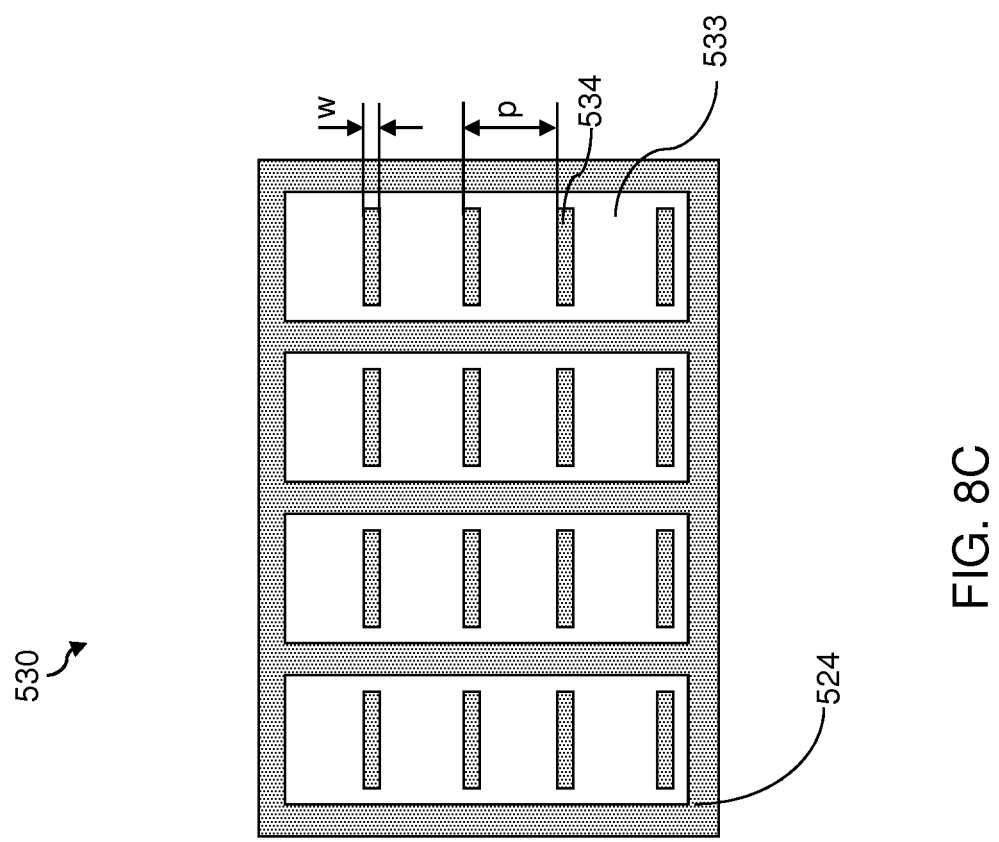
FIG. 8C is a top-down view of a third alignment structure pattern within a third reticle in the third exemplary plurality of reticles according to the second embodiment of the present disclosure.

While the embodiments illustrated above employs two reticles and two separate photolithography processes, the alignment scheme illustrated above can be extended to employ more than two reticles. Referring to FIGS. 8A-8C, alignment structure patterns for a set of n reticles is illustrated for an embodiment that employs n reticles and n separate photolithography processes sequentially performed to replicate the pattern within each of the n reticles in the same material layer.

The set of n reticles includes a first reticle, a second reticle, and additional reticles up to the n-th reticle 0. The number n can be any positive integer greater than 1. Each reticle in the set of n reticles includes an alignment structure pattern at a same relative location. A first alignment structure pattern 330 that can be employed for the first reticle is illustrated in FIG. 8A, a second alignment structure pattern 430 that can be employed for the second reticle is illustrated in FIG. 8B, and the n-th alignment structure pattern 530 that can be employed for the n-th reticle is illustrated in FIG. 8C.

Each alignment structure pattern (330, 430, 530) includes a set of gratings (333, 433, or 533). Each set of gratings (333, 433, or 533) includes process segmentations (334, 434, or 534). The process segmentations (334, 434, 534) have a reticle segmentation pitch p within each of the gratings (333, 433, or 533). For each i between and including 1 and (n−1), the relative position of the alignment structure pattern in an (i+1)-th reticle is laterally offset by a distance of 1/n times the reticle segmentation pitch p in the direction of the reticle segmentation pitch p relative to the corresponding alignment structure pattern in an i-th reticle.

Each reticle among the set of reticles includes an optically transparent substrate including a patterned optically opaque layer. In one embodiment, the area of a set of gratings (333, 433, 533) can be defined by presence of openings in a patterned optically opaque layer, and the process segmentations (334, 434, 534) can be defined by absence of openings in the patterned optically opaque layer in corresponding areas. In another embodiment, the area of the set of gratings (333, 433, 533) can be defined by absence of openings in a patterned optically opaque layer in corresponding areas, and the process segmentations (334, 434, 534) can be defined by presence of openings in the patterned optically opaque layer. Each reticle among the set of reticle includes a device pattern area in which a component of a semiconductor device or an interconnect element is defined by transparency or opacity of a corresponding area therein.

The set of reticles are sequentially employed to transfer a component pattern from each reticle into the same material layer over n repetitions of lithographic processing sequences. Each of the multiple printed lithographic patterns is formed by a separate lithographic processing sequence, i.e., a total of n lithographic processing sequences. Each of the separate lithographic processing sequences includes application of a photoresist-including layer, lithographic exposure of the photoresist-including layer, and transfer of a lithographic pattern in the photoresist-including layer into the material layer by an etch. Each photoresist-including layer can include an organic planarizing layer, a photoresist, and an antireflective coating (ARC) layer. Each lithographic exposure of the photoresist-including layer employs one of the n reticles. Each of the reticles is aligned for lithographic exposure such that the images of the gratings (333, 433, 533) are formed in the same location at each lithographic exposure.

Because of the lateral offset among the various process segmentations (334, 434, 534) across the various reticles in the set of n reticles, each set of printed process segmentation structures is laterally offset from another set of printed process segmentation structures by 1/n times the printed segmentation pitch. Each subsequently formed set among the sets of printed process segmentation structures is laterally offset by a distance of j/n times the printed segmentation pitch in a direction of the printed segmentation pitch relative to a previously formed set among the sets of printed process segmentation structures. The number n is the total number of multiple printed lithographic patterns, which is the same as the total number of reticles. The number j is a positive integer less than n.

Thus, a material layer on a substrate can be patterned by sequentially forming n printed lithographic patterns therein. Each of the multiple printed lithographic patterns includes a set of printed process segmentation structures having a printed segmentation pitch. The printed segmentation pitch determined by the reticle segmentation pitch p and a scaling factor determined by the optics of the exposure tool employed for the n reticles. Each reticle generates a set of printed segmentation structures that is offset from another set by k/n times the printed segmentation pitch, in which k is a positive integer less than n.

After printing all patterns in the plurality of reticles, a composite printed process segmentation structure on the substrate includes printed segmentation structures that are spaced by 1/n times the printed segmentation pitch. The n sets of printed process segmentation structures collectively form composite printed process segmentation structures having a composite printed segmentation pitch that is 1/n times the printed segmentation pitch. The pattern for the next level can be aligned to the composite printed process segmentation structure in a single alignment operation.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a patterned structure comprising:
patterning a material layer on a substrate by sequentially forming multiple printed lithographic patterns therein, wherein each of said multiple printed lithographic patterns includes a set of printed process segmentation structures having a printed segmentation pitch, and said sets of printed process segmentation structures collectively form composite printed process segmentation structures having a composite printed process segmentation pitch that is 1/n times said printed segmentation pitch, wherein n is a total number of said multiple printed lithographic patterns; and
aligning a reticle to said substrate employing said composite printed process segmentation structures as a reference structure for alignment.

2. The method of claim 1, wherein each of said multiple printed lithographic patterns is formed by a separate lithographic processing sequence, each of said separate lithographic processing sequences including application of a photoresist-including layer, lithographic exposure of said photoresist-including layer, and transfer of a lithographic pattern in said photoresist-including layer into said material layer by an etch.

3. The method of claim 1, wherein each set of printed process segmentation structures is formed by etching corresponding portions of said material layer.

4. The method of claim 1, further comprising:
forming another material layer over said patterned material layer; and
applying a photoresist-including layer on said another material layer prior to said aligning of said reticle, wherein said reticles is aligned to said substrate while said photoresist-including layer is present on said substrate.

5. The method of claim 4, further comprising:
lithographically exposing said photoresist-including layer employing said reticle as an exposure mask; and
transferring a pattern in said lithographically exposed photoresist-including layer into said other material layer by an etch.

6. The method of claim 4, further comprising forming additional printed process segmentation structures in said another material layer employing said reticle, wherein an area of said additional printed process segmentation structure does not overlie an area of said composite printed process segmentation structures.

7. The method of claim 1, wherein each set of printed process segmentation structures is laterally offset from another set of printed process segmentation structures by 1/n times said printed segmentation pitch.

8. The method of claim 1, wherein each subsequently formed set among said sets of printed process segmentation structures is laterally offset by a distance of j/n times said printed segmentation pitch in a direction of said printed segmentation pitch relative to a previously formed set among said sets of printed process segmentation structures, wherein n is a total number of multiple printed lithographic patterns, and j is a positive integer less than n.

9. The method of claim 1, wherein said multiple printed lithographic patterns are sequentially formed by a set of lithographic process sequences employing a set of reticles, wherein each reticle includes a reticle pattern corresponding to one multiple printed lithographic patterns.

10. The method of claim 9, wherein each reticle in said set of reticles includes an alignment structure pattern at a same relative location, each alignment structure pattern comprising a set of gratings including process segmentations, wherein said process segmentations have a reticle segmentation pitch p within each of said gratings.

11. The method of claim 10, wherein a relative position of said alignment structure pattern in an (i+1)-st reticle is laterally offset by a distance of 1/n times said reticle segmentation pitch p in a direction of said reticle segmentation pitch p relative to a corresponding alignment structure pattern in an i-th reticle for each i between and including 1 and (n−1), wherein n is a total number of reticles in said set of reticles.

12. The method of claim 10, wherein a total number of reticles in said set of reticles equals a total number of printed lithographic patterns in said multiple printed lithographic patterns.

13. The method of claim 10, wherein each reticle among said set of reticles includes an optically transparent substrate and a patterned optically opaque layer thereupon.

14. The method of claim 13, wherein an area of said set of gratings is defined by presence of openings in said patterned optically opaque layer, and said process segmentations are defined by absence of openings in said patterned optically opaque layer in corresponding areas.

15. The method of claim 13, wherein an area of said set of gratings is defined by absence of openings in said patterned optically opaque layer in corresponding areas, and said process segmentations are defined by presence of openings in said patterned optically opaque layer.

* * * * *